(12) United States Patent
Suzuki et al.

(10) Patent No.: US 10,635,534 B2
(45) Date of Patent: Apr. 28, 2020

(54) NONVOLATILE MEMORY MODULE

(71) Applicant: HITACHI, LTD., Tokyo (JP)

(72) Inventors: Akifumi Suzuki, Tokyo (JP); Shimpei Nomura, Tokyo (JP); Yuto Kamo, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

(21) Appl. No.: 16/119,711

(22) Filed: Aug. 31, 2018

(65) Prior Publication Data

US 2019/0205207 A1 Jul. 4, 2019

(30) Foreign Application Priority Data

Dec. 28, 2017 (JP) ................................ 2017-255037

(51) Int. Cl.
| | |
|---|---|
| *G11C 29/00* | (2006.01) |
| *G06F 11/10* | (2006.01) |
| *G11C 29/52* | (2006.01) |
| *G06F 3/06* | (2006.01) |
| *G11C 5/04* | (2006.01) |
| *G11C 29/04* | (2006.01) |

(52) U.S. Cl.
CPC ........ *G06F 11/1068* (2013.01); *G06F 3/0619* (2013.01); *G06F 3/0644* (2013.01); *G06F 3/0679* (2013.01); *G11C 5/04* (2013.01); *G11C 29/52* (2013.01); *G11C 2029/0411* (2013.01)

(58) Field of Classification Search
CPC .. G06F 11/1068; G06F 3/0679; G06F 3/0644; G06F 3/0619; G11C 29/52; G11C 2029/0411
See application file for complete search history.

(56) References Cited

U.S. PATENT DOCUMENTS

| | | | |
|---|---|---|---|
| 2008/0072120 A1* | 3/2008 | Radke | ................. G06F 11/1068 714/768 |
| 2012/0254686 A1 | 10/2012 | Esumi et al. | |
| 2013/0159785 A1* | 6/2013 | Hashimoto | ........... G06F 11/004 714/47.2 |

\* cited by examiner

*Primary Examiner* — Samir W Rizk
(74) *Attorney, Agent, or Firm* — Volpe and Koenig, P.C.

(57) ABSTRACT

In technique for dividing ECC large in size, plural ECCs of different sizes are required to be managed and control over storage areas of NVM is intricate. In addition, a relatively reliable page (a minimum record unit) and a relatively unreliable page are determined beforehand depending upon which recording method is adopted. However, as dispersion exists in quality among NVMs, it may occur among NVMs that dispersion in an error bit count is great among pages of the same reliability. An NVM controller in a nonvolatile memory (NVM) module divides the ECCCW into N pieces (N: two or a larger integer) of ECCCW portions and records the N pieces of ECCCW portions in N pieces of storage areas out of plural storage areas in one or more NVMs configuring an NVM section.

11 Claims, 13 Drawing Sheets

FIG. 7

| 810 | 811 | 812 | 813 | 814 | 815 |
|---|---|---|---|---|---|
| | FM GROUP NUMBER | FM-A NUMBER | FM-B NUMBER | RETRY COUNTER | ERROR BIT COUNTER |
| | 0 | 0 | 8 | 134 | 134 |
| | 1 | 1 | 9 | 95321 | 95321 |
| | : | : | : | : | : |
| | ... | ... | ... | ... | ... |

| 820 | 821 | 822 | 823 | 824 | 825 |
|---|---|---|---|---|---|
| | LBA | FM GROUP NUMBER | BLOCK NUMBER | PAGE NUMBER | OFFSET |
| | XXXX_0000 | 3 | 1354 | 32 | YY |
| | XXXX_0008 | UNALLOCATED | | | |
| | XXXX_0010 | 15 | 2639 | 56 | YY |
| | : | : | : | : | : |

800

FIG. 13
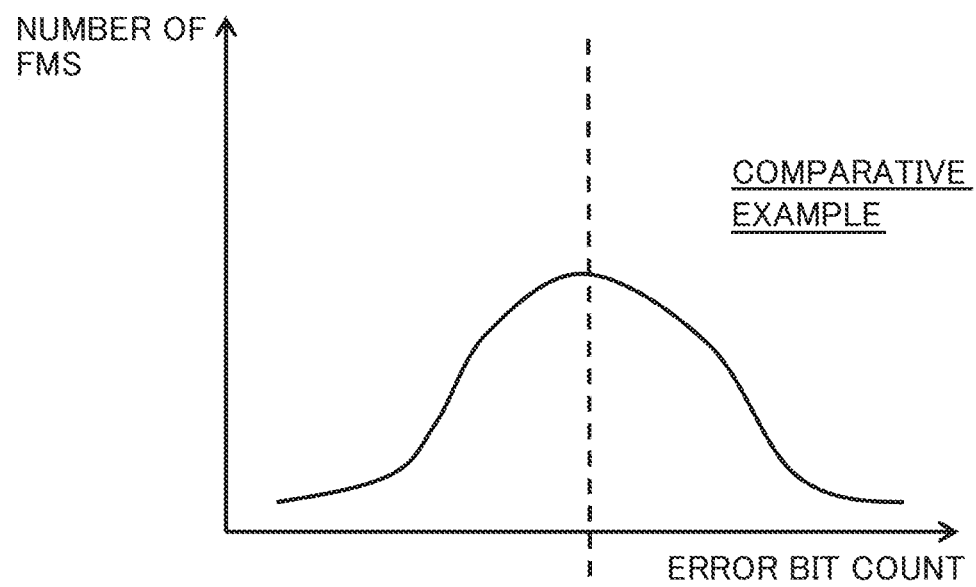
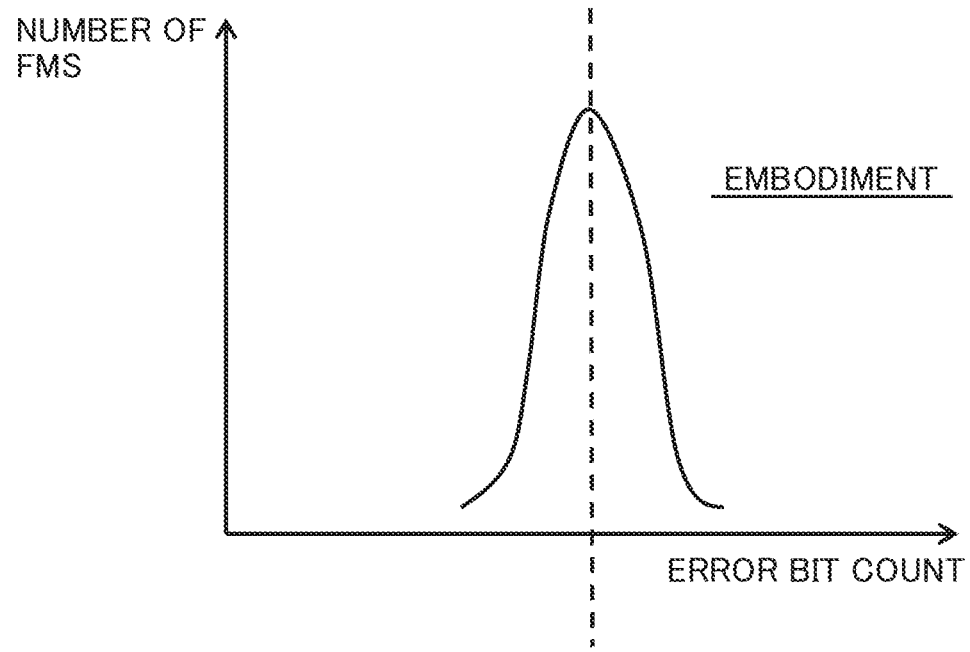

NONVOLATILE MEMORY MODULE

BACKGROUND

The present invention generally relates to storage control in a nonvolatile memory module.

A nonvolatile memory module (hereinafter called an FM module) equipped with a NAND-type flash memory (hereinafter called FM) such as a solid-state drive (hereinafter called SSD) is known as one example of a nonvolatile memory (NVM) module provided with a nonvolatile memory (NVM) (typically a nonvolatile semiconductor memory). The FM module can write and read data at higher speed than a hard disk drive (HDD) which has been used for a medium for long-term storage of an enterprise system. The FM module for enhancing performance of a system is being widely utilized in place of HDD or for another application. Such extension of utilization of the FM module is enabled by reduction of a bit cost of the FM by micronization and multi-valuing.

The FM is configured by cells for storing electrons and a value is recorded by relating the number of electrons injected into the cell and a bit count of data. When the number of the electrons increases or decreases as time goes, the related bit count varies. As a result, an error bit is caused. Recently, as a bit count varies even due to slight electron transfer because of micronization and multi-valuing, error bits of the FM are apt to increase. In addition, a margin (difference between threshold voltage and read voltage) for absorbing difference in reliability of a storage area decreases and difference in reliability (difference in an error bit occurrence count) every storage area comes to remarkably emerge.

Then, an FM controller (a controller for the FM module) realizes precise data holding by generating an error correction code (ECC) codeword (ECCCW) acquired by applying ECC for correcting an error bit to record data when data is recorded in the FM and correcting an error bit caused in the ECCCW using the ECC in reading. Such technique is disclosed in United States Patent No. 2012/0254686.

In this specification, a minimum recording unit of the FM is hereinafter called a page and a minimum erasing unit is hereinafter called a block.

SUMMARY

The FM is a device to which data cannot be overwritten and erasing is essential to vary data. However, the FM is deteriorated by repetition of erasing and an error bit count in a storage area (for example, a page or a block) increases due to the deterioration. Therefore, it is required to limit an erasing frequency of the FM.

As in the FM module such as SSD, updating of data is made impossible when a part of a mounted storage area is unavailable, utilization of not only a partial area but the whole FM is made impossible. Therefore, an executable erasing frequency (that is, an executable minimum erasing frequency in the FM module) related to inferior FM and an unreliable storage area is required to be defined as an upper limit value of erasing frequencies (hereinafter, this value is called an allowable erasing frequency) of all FMs mounted in the FM module. As a result, the allowable erasing frequency of the FM module decreases due to a part of FM or storage area. As described above, as the FM is a device to which data cannot be overwritten, erasing is essential to vary data. Accordingly, a decrease of the allowable erasing frequency of the FM module is to be a decrease of rewritable data volume.

In the technique disclosed in the United States Patent No. 2012/0254686, ECC (ECC in large size) having high data correction capability is applied to data recorded in a page (hereinafter called a page B) having a relatively many error bit count and ECC (ECC in small size) having low data correction capability is applied to data recorded in a page (hereinafter called a page S) having a relatively small error bit count. As in the technique, a part of the ECC applied to data recorded in the page B is applied as the ECC in small size, it is stored in the page S having a space area.

In the United States Patent No. 2012/0254686, plural ECCs different in size are required to be managed and control over a storage area of the FM is intricate. For example, in the United States Patent No. 2012/0254686, size of data (a portion except the ECC in the ECCCW) is grasped every page and it is considered that in reclamation processing, processing such as padding or alignment is required on the basis of the size of the data to be transferred.

In addition, a page having relatively high reliability and a page having relatively low reliability are determined beforehand depending upon adopting any recording method of plural recording methods such as a multiple level cell (MLC) and a triple level cell (TLC). However, generally, dispersion exists in quality of the FM. As a result, a situation that dispersion in an error bit count between the FMs as to pages having the same reliability is great may occur.

This type of problem may also be caused in NVM except the FM.

In an NVM module, an NVM controller divides each ECCCW into N pieces of (N: two or a larger integer) ECCCW portions and respectively records the N pieces of ECCCW portions in N pieces of storage areas of plural storage areas in one or more NVMs configuring an NVM section.

According to the present invention, an error bit count in the plural storage areas in the NVM section can be leveled, inhibiting complication of control over the storage areas in the NVM section including one or more NVMs.

BRIEF DESCRIPTION OF THE DRAWINGS

FIG. 7 shows a configuration of management information held by the FM module;

FIG. 13 shows an outline of a result of error bit count leveling in the embodiment.

DETAILED DESCRIPTION

Figure 1:
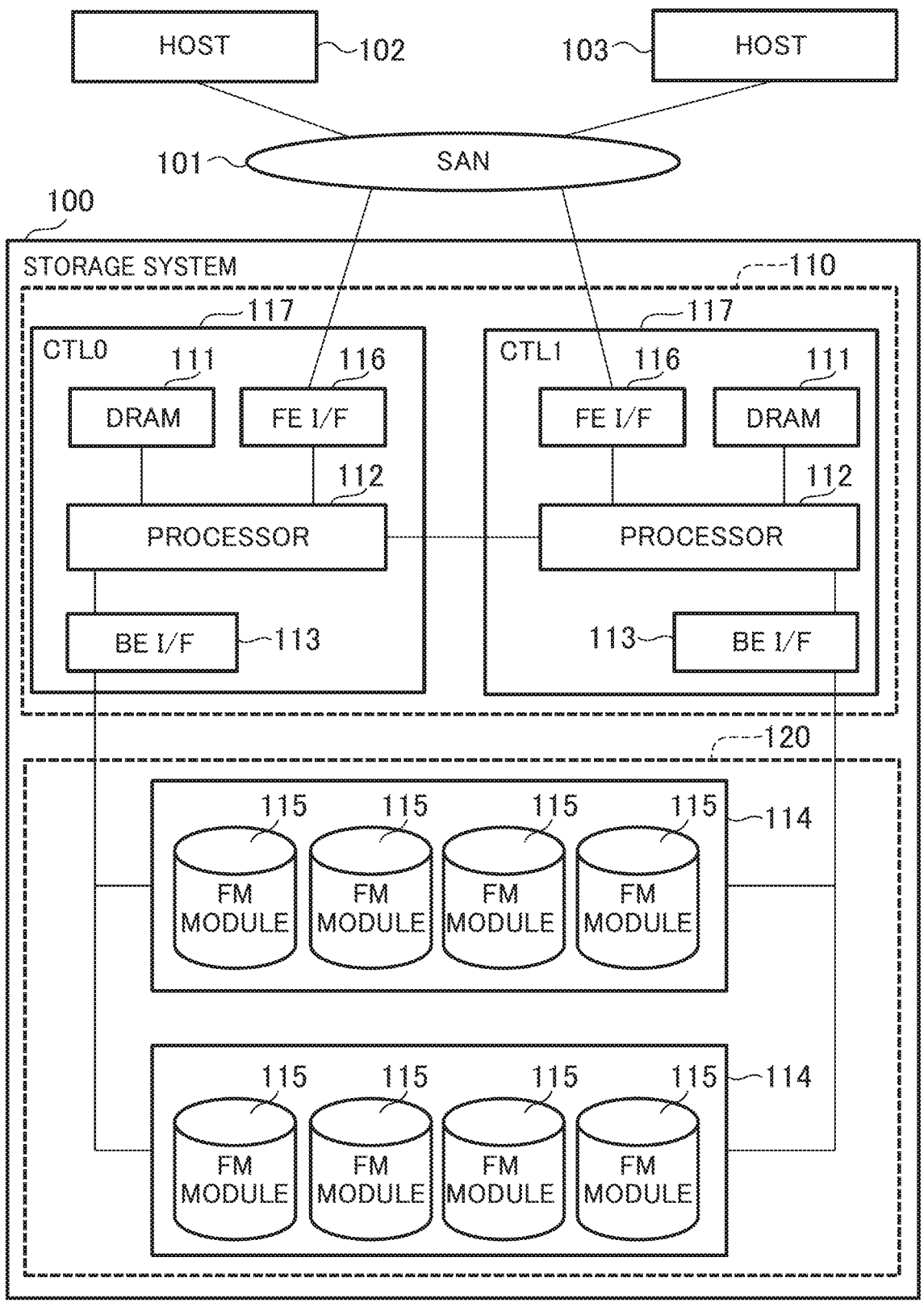
FIG. 1 is a block diagram showing the whole system including a storage system equivalent to an embodiment.

In the following description, for an interface, one or more interfaces may be included. The one or more interfaces may include a user interface and at least one communication interface of communication interfaces. The user interface may also be at least one input-output device out of one or more input-output devices (for example, an input device such as a keyboard and a pointing device and an output device such as a display device) and a computer for display, and in place of it or in addition to it, the user interface may also be an interface device for at least one input-output device. The communication interface may be one or more communication interface devices. One or more communication interface devices may also be one or more same type communication interface devices such as one or more network interface cards (NIC) and may also be two or more different type communication interface devices such as NIC and a host bus adapter (HBA).

In the following description, a memory section may be configured by one or more memories. At least one memory may also be a volatile memory and may also be a nonvolatile memory. The memory section is mainly used in processing by a processor. In addition, in the following description, a PDEV section may be configured by one or more PDEVs. The PDEV means a physical nonvolatile storage device. The PDEV section may also be a RAID group. RAID is an abbreviation of a redundant array of independent (or inexpensive) disks. At least one of at least one PDEV in the PDEV section is an NVM module being a storage device including a nonvolatile memory. Some of memories in the memory section may also be NVM modules. A nonvolatile memory in the NVM module is FM in the following embodiment. The FM is a NAND-type flash memory. However, the FM may also be a flash memory except an NAND type. In addition, the nonvolatile memory may also be a nonvolatile memory except FM, for example, a phase-change random access memory (PRAM), a magnetoresistive random access memory (MRAM), a resistive random access memory (ReRAM) or a ferroelectric random access memory (FeRAM).

Moreover, in the following description, a processor section may be configured by one or more processors. At least one processor is typically a microprocessor such as a central processing unit (CPU). However, at least one processor may also be another type processor such as a graphics processing unit (GPU). Each of one or more processors may also be single-core or may also be multi-core. A part of processors may also be a hardware circuit that executes a part or the whole of processing (for example, a field-programmable gate array (FPGA) or an application specific integrated circuit (ASIC).

In addition, in the following description, processing executed by the processor section is typically realized by executing one or more computer programs by the processor section. However, a part of the processing may also be realized by one or more hardware circuits. When the processing is executed by executing the program by the processor section, the processing is executed suitably using the memory section and/or an interface and others. The program may also be installed from a program source. The program source may also be a record medium (for example, a non-temporary record medium) readable by a program distributed computer or a computer for example.

Further, in the following description, information may be described in expression such as some table. However, information may also be expressed with any data structure. That is, to show that information does not depend upon data structure, some table may be described as some information. Furthermore, in the following description, a configuration of each table is one example, one table may also be divided into two or more tables, and the whole or a part of two or more tables may also be one table.

Furthermore, in the following description, a storage system includes one or more physical storage devices. At least one physical storage device may also be a general purpose physical computer. At least one physical storage device may also execute a virtual computer (for example, a virtual machine (VM)) and may also execute software-defined anything (SDx). For the SDx, a software defined storage (SDS)(one example of a virtual storage device) or a software-defined datacenter (SDDC) can be adopted for example.

Furthermore, in the following description, when the same type of elements are described without discriminating them, a reference numeral (for example, FM 320) of the elements or a common portion (an ECCCW portion 603) of a reference numeral may be used. When the same type of elements are described with the elements discriminated, IDs (for example, FM0, FM1) of the elements or reference numerals (an ECCCW portion 63*a*, an ECCCW portion 63*b*) of the elements may be used.

One embodiment of the present invention will be described referring to the drawings below. However, the present invention is not limited to the following embodiment. In addition, in the following description, to avoid confusion, a request for a storage system is called a request, a request for an FM module (one example of an NVM module) may be called a command, and a request for FM (one example of NVM) may be called a direction.

Figure 12:
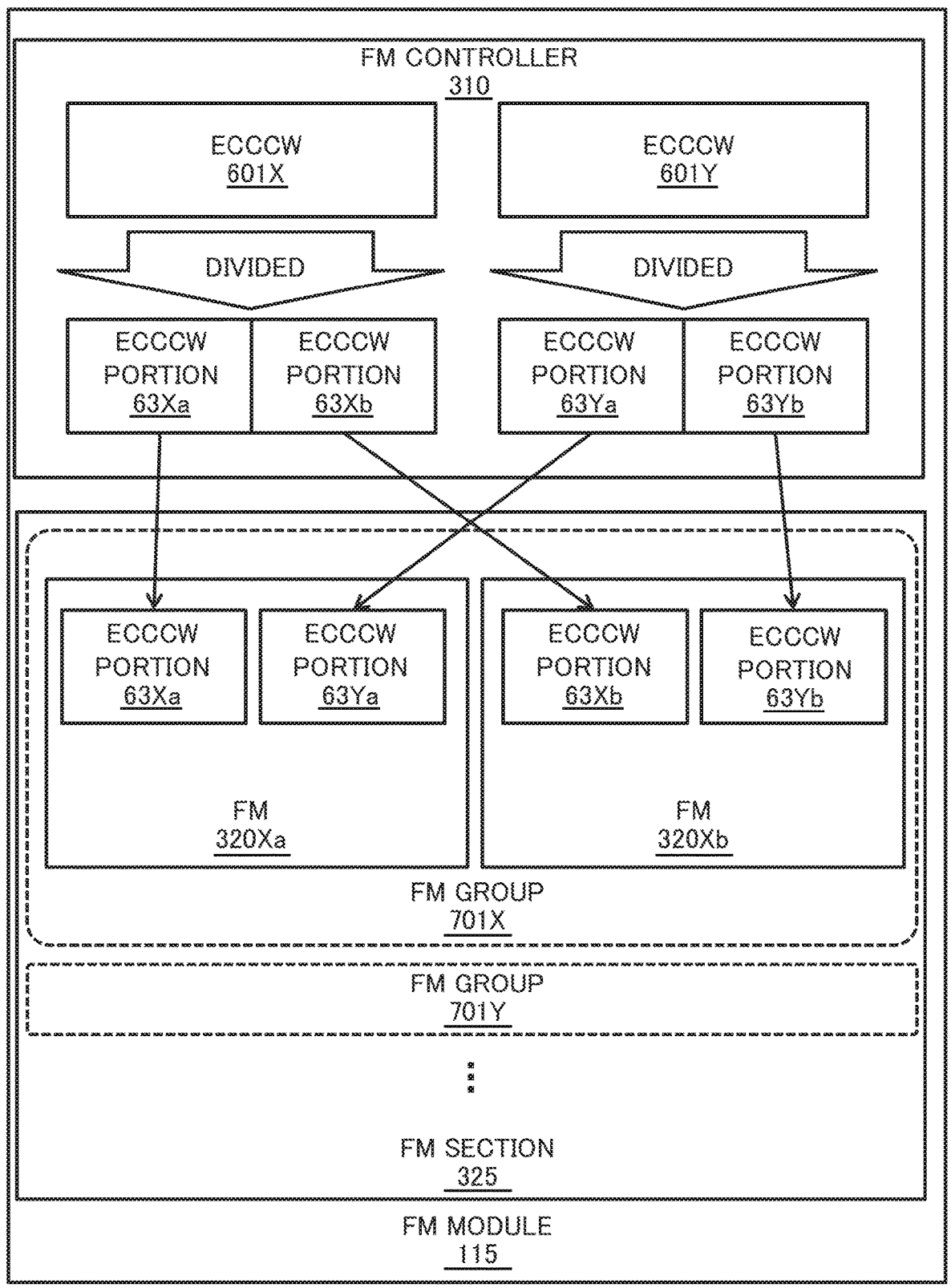
FIG. 12 shows an outline of the embodiment.

FIG. 12 shows an outline of this embodiment.

The FM module 115 is provided with an FM section 325 and an FM controller 310 that controls input/output to/from the FM section 325. The FM section 325 includes plural FMs 320. The FM section 325 is provided with plural FM groups 701. Each FM group 701 is configured by N pieces (N: two or a larger integer) of FMs 320. In this embodiment, FM 320 is one example of a storage area. In addition, in this embodiment, N is two.

The FM controller 310 generates an ECC codeword (ECCCW) 601 by applying an error correction code (ECC) to data to be recorded. The ECCCW 601 is a correction unit of an error bit. The FM controller 310 divides the ECCCW 601 into two (that is, the same number as the FMs 320 configuring the FM group 701) ECCCW portions 63*a*, 63*b*, and N pieces of ECCCW portions 63*a*, 63*b* are recorded in the corresponding two FMs 320 configuring the FM group 701 to be recorded (to be written). According to an example shown in FIG. 12, ECCCW 601X is divided into two ECCCW portions 63Xa, 63Xb, and the two ECCCW portions 63Xa, 63Xb are recorded in corresponding FMs 320Xa, 320Xb respectively configuring an FM group 701X. In addition, ECCCW 601Y is divided into two ECCCW portions 63Ya, 63Yb, and the two ECCCW portions 63Ya, 63Yb are recorded in the corresponding FMs 320Xa, 320Xb.

As described above, the ECCCW being the correction unit of an error bit is recorded in the different two FMs 320. Therefore, dispersion in quality between the FM 320 is leveled and consequently, an error bit count in the plural FMs 320 is leveled. Concretely, as shown in FIG. 13 for example, in a comparative example in which ECCCW is recorded in one FM, dispersion in an error bit count among FMs is relatively large. However, in this embodiment in which the ECCCW is recorded in N pieces (N: two or a larger integer) of the FMs 320, an error bit count is leveled between the FMs 320 (that is, dispersion in an error bit count is relatively small between the FMs 320). As the dispersion in quality between the FMs 320 is leveled, an allowable erasing frequency of the FM module 115 is increased, compared with that in the comparative example.

This embodiment will be described in detail below.

(1-1) System Configuration

First, a system configuration in one embodiment of the present invention will be described referring to FIG. 1.

FIG. 1 is a block diagram showing the whole system including a storage system equivalent to one embodiment of the present invention.

The storage system 100 is connected to one or plural hosts 102 via a communication network such as a storage area network (SAN) 101. According to a request from the host 102, the storage system 100 records data in a record medium (one or plural FM modules 115 in this embodiment) inside the storage system 100. Or the storage system reads data from the record medium inside the storage system 100. The storage system 100 is provided with an FM module section 120 (one example of a PDEV section) and a storage controller 110 connected to the FM module section 120 as shown in FIG. 1.

The storage controller 110 is configured by one or plural controllers (CTL) 117 for example. The CTL 117 is provided with a processor 112, a dynamic random access memory (DRAM) 111, a front end interface 116 and a back end interface 113. At least two or more CTLs 117 are mounted in the storage system 100 so as to secure redundancy and the storage system is designed so that when failure occurs in certain CTL 117, processing can be continued in the other CTL 117. The processor 112 is one example of processors. The DRAM 111 is one example of memories. The front end interface 116 and the back end interface 113 are one example of interfaces.

The processor 112 is a component that controls the storage system 100 and is connected to the front end interface 116, the DRAM 111 and the back end interface 113. The processor 112 controls various data transfers in the storage system 100 by executing a program for controlling the storage system 100.

The front end interface 116 is an interface for connecting the storage system 100 with the SAN 101 and transfers a request and data via the SAN 101 according to a protocol such as Ethernet (a registered trademark) and a fibre channel (FC).

The DRAM 111 is a component that stores a control program and temporarily stores data and temporarily stores data received from the host 102 (one example of a high order device) as a write cache. At this time, redundancy can be secured by copying write data received from the host 102 in the DRAM 111 of another CTL 117.

The back end interface 113 is an interface for connecting to the FM module 115 and transfers various commands and various data according to a protocol such as serial attached SCSI (SAS) and FC.

The FM module section 120 is configured by one or plural expanders 114 respectively including plural FM modules 115.

The expander 114 stores plural FM modules 115 and is connected to the back end interface 113.

The FM module 115 is loaded with the FMs inside and records data in the FM according to a command from a high order device (in this case, the CTL 117). Or the FM module reads data from the FM. The CTL 117 controls the plural FM modules 115 and can record data with the data redundant across the plural FM modules 115. This function prevents data from disappearing when failure suddenly occurs in the FM module 115. For one example of such technique, a redundant array inexpensive disk (RAID) can be given.

Figure 2:
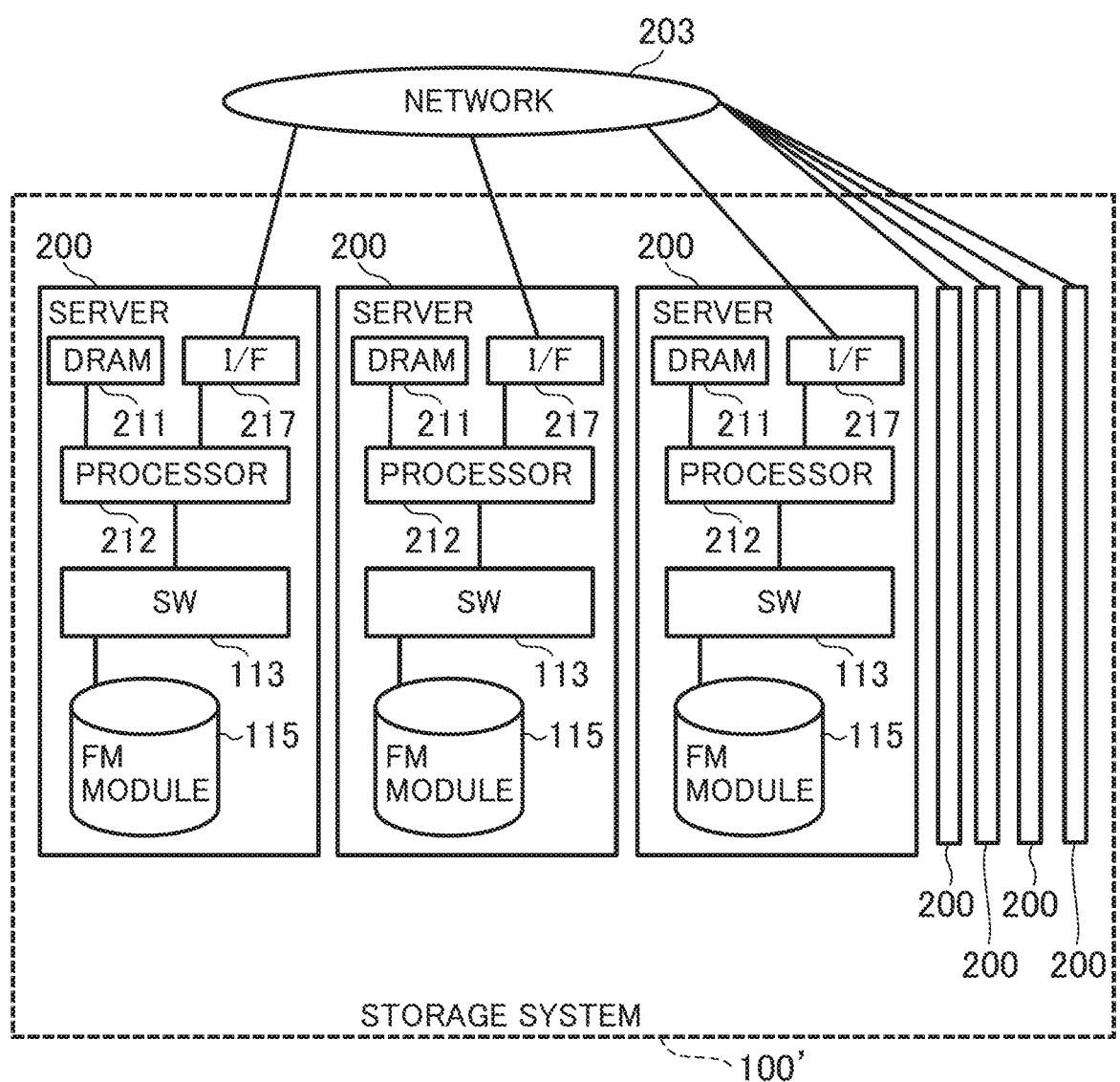
FIG. 2 is a block diagram showing a storage system equivalent to one transformed example.

The abovementioned configuration is one example of the system configuration. The present invention is not limited to the system configuration shown in FIG. 1. The present invention can also be applied to another system in which data is stored in the FM module 115 and is retained for long time. For example, a system configuration shown in FIG. 2 may also be adopted. FIG. 2 shows a system including a storage system 100' configured by plural servers 200 (nodes).

FIG. 2 shows a configuration of the storage system 100' in one transformed example. Each server 200 configuring the storage system 100' is provided with DRAM 211 being a temporary storage area, a processor 212 that executes various processing according to software, SW 213 connecting various peripheral equipment, an FM module 115 to be a secondary storage area and a network interface 217 for connecting to another server 200. In FIG. 2, the processor 212 and the FM module 115 are connected via the SW 113. However, the present invention is not limited to this example. The processor 212 may also be directly connected to the FM module 115. The example shown in FIG. 2 is one example that the processor 212 is a high order device of the FM module 115.

The DRAM 211 is connected to the processor 212 via connection accessible for short time from the processor 212 and is an area for storing a program processed by the processor 212 and data to be processed.

The processor 212 is operated according to a program so as to process target data. The processor 212 has plural processor cores inside and the processor core can process the program independently or cooperatively. In addition, the processor 212 has a DRAM controller inside and the DRAM controller acquires data from the DRAM 211 according to a request from the processor 212 or stores data in the DRAM 211. Moreover, the processor 212 has an input-output (I/O) interface to/from an external device and is connected to the SW 213. In addition, the processor 212 can transmit a command to the FM module 115 being a secondary storage device via the SW 213. The processor 212 executes various processing.

In the processor 212, for example, a hypervisor for generating a virtual machine may also be operated. Various applications may also be operated in the virtual machine. When this application continues to record data, an instruction to the virtual machine provided with a storage function may be virtually made. At this time, the processor 212 that processes the virtual machine provided with the storage function can record data stored in DRAM 211 in the FM module 115 according to a method of controlling the virtual machine provided with the storage function.

The SW 213 is a device that intermediates a high-speed external input/output bus and transfers a packet according to a standard for connection such as PCI-Express (a registered trademark) and Infiniband (a trademark) according to a routing method defined in the packet. The SW 213 can connect the plural FM modules 115 and communicates information between the processor 212 and any of various devices. In FIG. 2, the example in which one FM module 115 is connected to the SW 213 is shown. However, the present invention is not limited to this example. For example, two or more FM modules 115 may also be connected to the SW 213 and a different number of FM modules 115 may also be connected to the SW 213 in each server 200. For example, one FM module 115 is connected to the SW 213 in the certain server 200 and the two FM modules 115 may also be connected via the SW 213 in another server 200.

The FM module 115 is a secondary storage device that stores data such as data to be analyzed. The FM module 115 acquires data to be written from the DRAM 211 according to a write command (a command to which positional information of data to be written is related) for example from the processor 212.

The network interface 217 is an interface for connecting to the network 203 such as Ethernet for connecting the servers 200.

The storage system 100' in the one transformed example has been described referring to FIG. 2. The present invention can be applied to not only the abovementioned storage system 100 having the configuration shown in FIG. 1 but the storage system 100' having the configuration shown in FIG. 2 or a storage system having another configuration.

(1-2) Configuration of FM Module 115

Next, an internal configuration of the FM module 115 will be described referring to FIG. 3.

Figure 3:
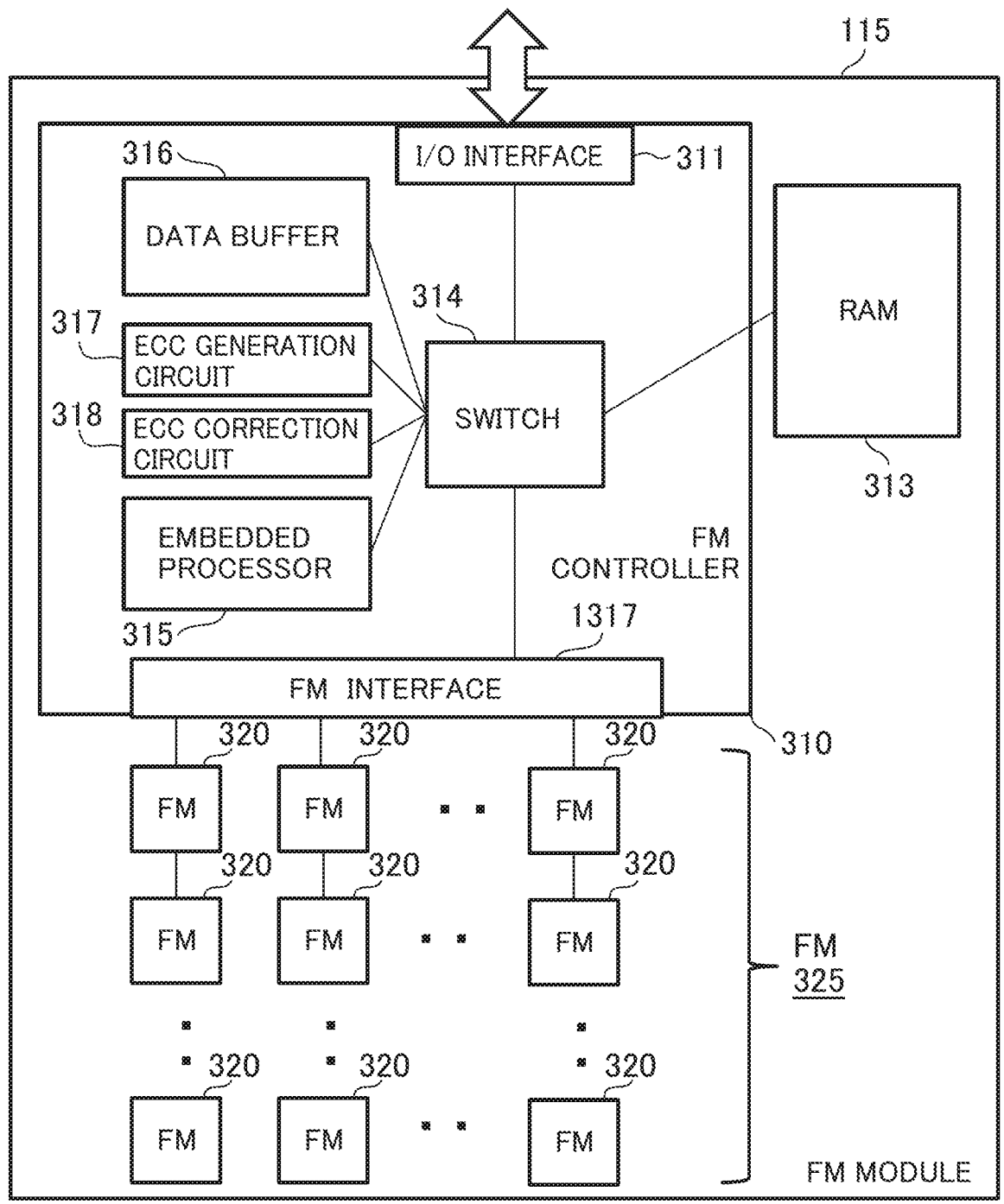
FIG. 3 shows an internal configuration of an FM module.

FIG. 3 shows the internal configuration of the FM module 115.

The FM module 115 is provided with the FM controller 310 and the FM section 325 inside. The FM section 325 includes plural (for example, 32 pieces of) FMs 320.

The FM controller 310 is provided with an embedded processor 315, a random access memory (RAM) 313, a data buffer 316, an input-output (I/O) interface 311, an FM interface 1317, an ECC generation circuit 317, an ECC correction circuit 318 and a switch 314 that mutually transfers data.

The switch 314 connects the embedded processor 315, the RAM 313, the data buffer 316, the I/O interface 311, the FM interface 1317, the ECC generation circuit 317 and the ECC correction circuit 318, and routes and transfers data between each device according to an address or ID. In this embodiment, as shown in FIG. 3, an example in which each hardware and a hardware implementation logic are connected to the single switch 314 in a star type is described. However, the present invention is not limited to this example. For example, plural switches 314 may also be provided inside so that each hardware and the hardware implementation logic respectively requiring connection can communicate.

The I/O interface 311 is a hardware implementation logic for connecting to a high order device. The I/O interface is connected to each device in the FM controller 310 via the switch 314. The I/O interface 311 receives various commands from the high order device and records the command in the RAM 313. In addition, the I/O interface 311 interrupts the embedded processor 315 when the interface receives a command from the high order device or records data notifying that the command is received in a storage area in the RAM 313 polled by the embedded processor 315.

The embedded processor 315 is connected to each device in the FM controller 310 via the switch 314 and controls the whole FM controller 310 on the basis of a program and management information respectively recorded in the RAM 313. In addition, the embedded processor 315 monitors the whole FM controller 310 by regular acquisition of information and a interrupt reception function.

The data buffer 316 stores temporary data in data transfer processing in the FM controller 310.

The FM interface 1317 is connected to the FM 320 via one or plural (for example, sixteen) buses. The plural (for example, four) FMs 320 are connected to each bus and the FM interface independently controls the plural FMs 320 connected to the same bus using a chip enable (CE) signal transmitted to the FM 320.

The FM interface 1317 is operated according to an instruction from the embedded processor 315. When the instruction is a reading instruction, the FM interface 1317 reads data from the FM 320 and transfers the data to the data buffer 316. When the instruction is a writing instruction, the FM interface 1317 reads data from the data buffer 316 and transfers the data to the FM 320.

The ECC generation circuit 317 generates the ECC for data in writing data.

The ECC correction circuit 318 checks data using the ECC in reading data and corrects the data when data loss (an error bit) is detected.

At least one of the switch 314, the I/O interface 311, the embedded processor 315, the data buffer 316, the FM interface 1317, the ECC generation circuit 317 and the ECC correction circuit 318 may also be configured in one semiconductor device as an application specific integrated circuit (ASIC) and a field programmable gate array (FPGA), and may also have a configuration acquired by mutually connecting plural individual dedicated integrated circuits (IC).

For the RAM 313, a volatile memory such as DRAM can be concretely given. The RAM 313 stores management information including information related to the FM 320 used in the FM module 115. The RAM 313 may also have a configuration including a part or the whole of functions of the data buffer 316 that stores data and used for data storage.

The configuration of the FM module 115 has been described referring to FIG. 3.

(1-3) Internal Structure of FM 320

Next, the FM 320 will be described referring to FIG. 4.

Figure 4:
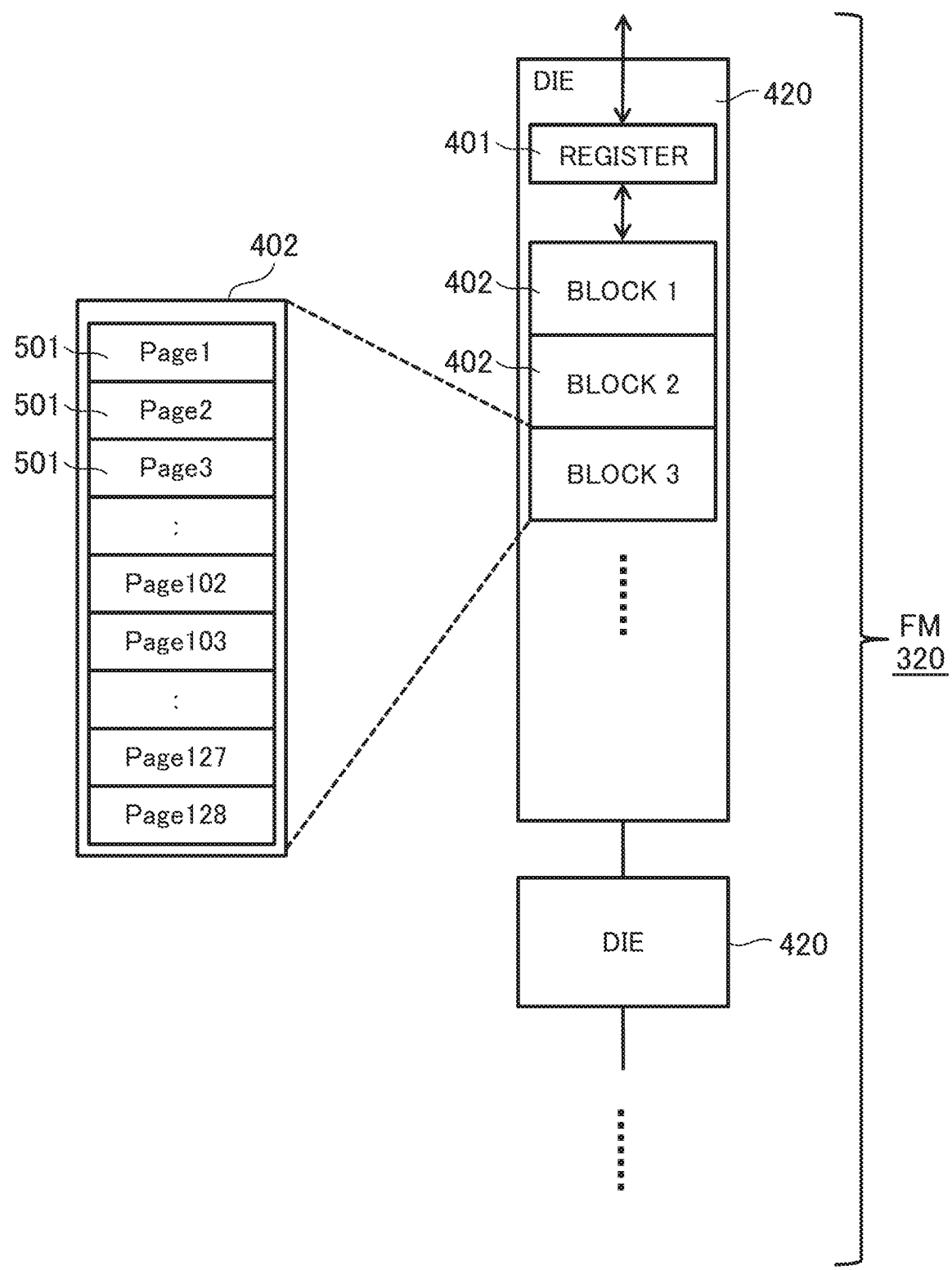
FIG. 4 shows an internal configuration of FM.

FIG. 4 shows an internal configuration of the FM 320.

A nonvolatile memory area in the FM 320 includes plural (or one) dies 420. The die 420 means an independently controllable unit (a storage area unit). Each die 420 includes plural blocks (physical blocks) 402. As a result, the FM 320 includes plural (for example, 4096 pieces of) blocks 402. A minimum easing unit is larger than a minimum recording unit and a minimum reading unit differently from the minimum recording unit and the minimum reading unit and is called a block. The minimum reading unit is called a page (a physical page) and the details will be described later. In the FM 320, a minimum writing unit and the minimum reading unit are the same, that is, a page unit. As the block is a minimum erasing unit as described above, stored data is erased in units of block. In addition, the FM 320 has an input-output (I/O) register 401 inside. The I/O register 401 is a register having storage capacity equal to or larger than page size (for example, 8 kB).

The FM 320 is operated according to a reading/writing direction from the FM interface 1317.

In writing operation, the RM 320 first receives a writing direction (a direction in which a write destination physical address (for example, a block number, a page number and an offset) is specified) from the FM interface 1317. Next, the FM 320 stores write data transferred from the FM interface 1317 in the I/O register 401. Afterward, the FM 320 writes the data stored in the I/O register 401 to a page to be written.

In reading operation, the FM 320 first receives a reading direction (a direction in which a read source physical address (for example, a block number, a page number and an offset) is specified) from the FM interface 1317. Next, the FM 320 reads data stored on a page of a specified block and stores the data in the I/O register 401. Afterward, the FM 320 transfers the data stored in the I/O register 401 to the FM interface 1317.

Each block 402 is provided with plural (for example, 128 pieces of) pages 501. Reading data and writing data are performed in units of page. In addition, order in which pages 501 in the block 402 are programmed (recorded) is fixed and the pages are required to be programmed in order from the leading page 501. Moreover, overwrite onto the already written page 501 is prohibited and unless data is erased from the block 402 including the page 501, data cannot be programmed on the page 501 again.

Figure 5:
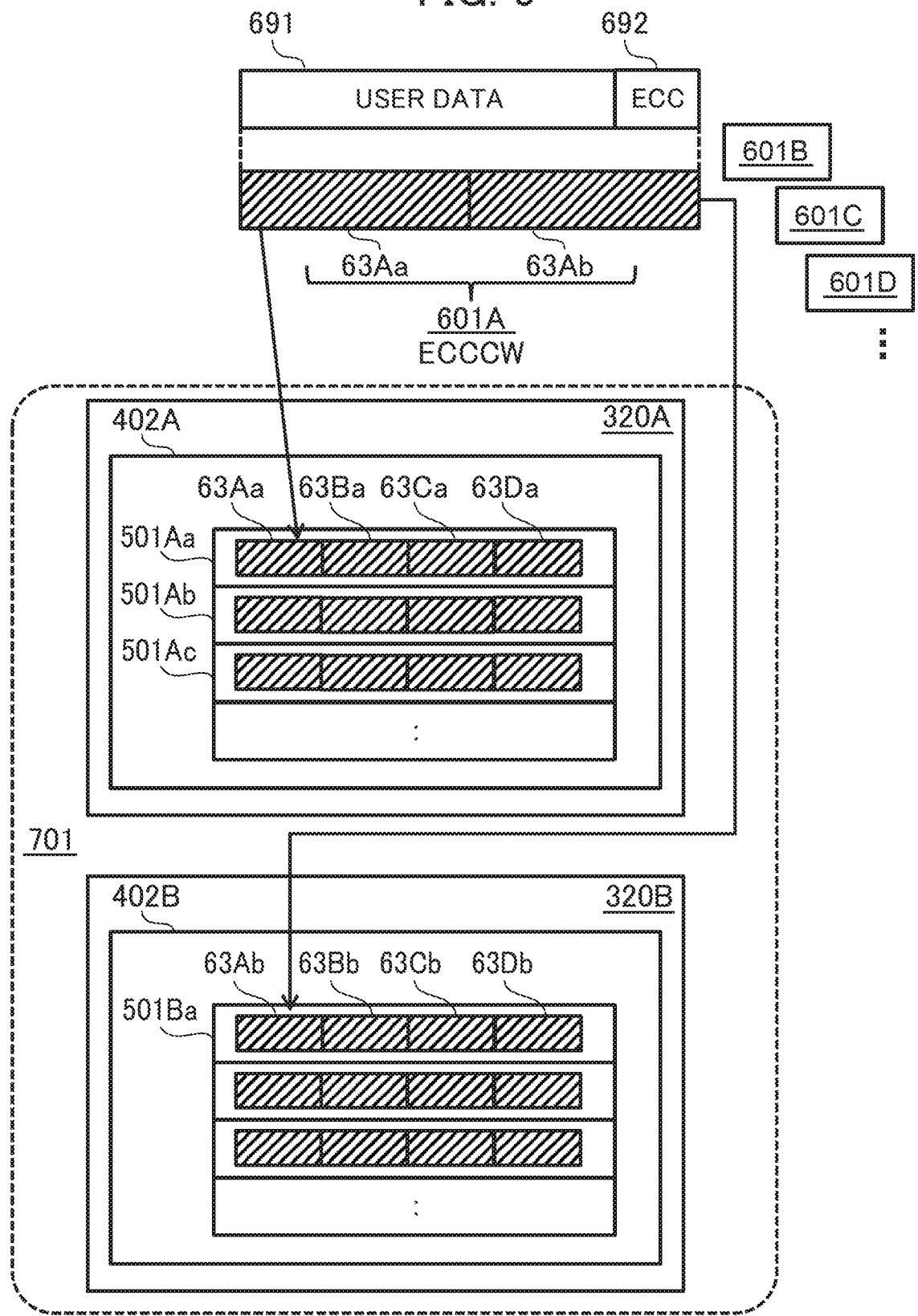
FIG. 5 shows a configuration of data recorded in a page.

Next, a configuration of data recorded on the page 501 in this embodiment will be described referring to FIG. 5.

The FM controller 310 generates ECC 692 using the ECC generation circuit 317 to correct data (hereinafter called user data) 691 received from a high order device (the CTL 117 in this embodiment). Data acquired by applying the ECC 692 to the user data 691 is the ECCCW 601.

In this embodiment, the ECCCW 601 is recorded in the two FMs 320 as each divided ECCCW portion. The present invention is not limited to this divided number and the ECCCW 601 may also be stored in more FMs 320 than two as each divided ECCCW portion. In this embodiment, ECCCW 601A is divided into ECCCW portions 63Aa, 63Ab.

In this embodiment, four ECCCW portions 63Aa, 63Ba, 63Ca, 63Da are recorded on a leading page 501Aa of a block 402A in an FM 320A. These four ECCCW portions 63Aa, 63Ba, 63Ca, 63Da are ECCCW portions acquired from four ECCCWs 601A to 601D. Four ECCCW portions corresponding to different four ECCCWs are also recorded on pages 501Ab, 501Ac, . . . except the leading page 501Aa. The present invention is not limited to this example and smaller or more ECCCW portions than four (for example, two or eight ECCCW portions) may also be recorded on one page 501.

The FM module 115 manages two FMs 320 as an FM group according to an FM group table described later. The FM 320A and the FM 320B configure the same FM group 701.

One of characteristics of this embodiment is to record the ECCCW 601 in plural FMs as each divided ECCCW portion. In this embodiment, the ECCCW portion 63Aa of the ECCCW 601A is recorded on the leading page 501Aa is also recorded on the leading page 501Aa of the block 402A in the FM 320A and the ECCCW portion 63Ab of the ECCCW 601A is recorded on a leading page 501Ba of a block 402B in the FM 320B in the same FM group 701 as the FM 320A. In this embodiment, an example that the two ECCCW portions 63a, 63b divided from the same ECCCW 601 are recorded on the pages 501 having the same number of the blocks 402 of the different FMs 320 is adopted. However, the present invention is not limited to this example. For example, N pieces of ECCCW portions divided from the same ECCCW may also be recorded on any page of any block of different N pieces of FMs 320. However, it is considered that data volume in a logical-to-physical address conversion table (a table for managing a location in which the ECCCW is stored) referred when the ECCCW is restored increases in a configuration that an ECCCW portion is recorded in an arbitrary block and on an arbitrary page without a fixed rule. Therefore, in this embodiment, the N pieces of ECCCW portions divided from the same ECCCW are recorded in the blocks having the same number and on the pages having the same number in the different N pieces of FMs.

The internal configuration and the data storage configuration of the FM 320 in this embodiment have been described. As described above, even if low-quality FM 320 rarely exists, data stored in the FM 320 is only a part of the ECCCW being an error bit correction unit and an error bit count caused in one ECCCW decreases by dividing the ECCCW 601 and dispersively recording divided ECCCW portions in N pieces of FMs 320, compared with a case that the whole ECCCW is stored in the low-quality FM 320. As described above, according to this embodiment, an effect of the low-quality FM 320 can be reduced.

The FM 320 is one example of each of N pieces of storage areas in which N pieces of ECCCW portions acquired by dividing the same ECCCW are recorded. However, each of the N pieces of storage areas may be the same storage area as the minimum recording unit or a storage area in a larger unit. Hereby, one ECCCW (N pieces of ECCCW portions) is not recorded in the same storage area in the minimum recording unit and is dispersed in storage areas different at least in a recording unit. Hereby, even if dispersion in quality exists among storage areas at least in the minimum recording unit, the quality is leveled and as a result, an error bit count can be expected to be leveled. Each of N pieces of storage areas may be any of the page 501, the block 402 and the die 420 in place of the FM 320.

(1-4) FM Group

Figure 6:
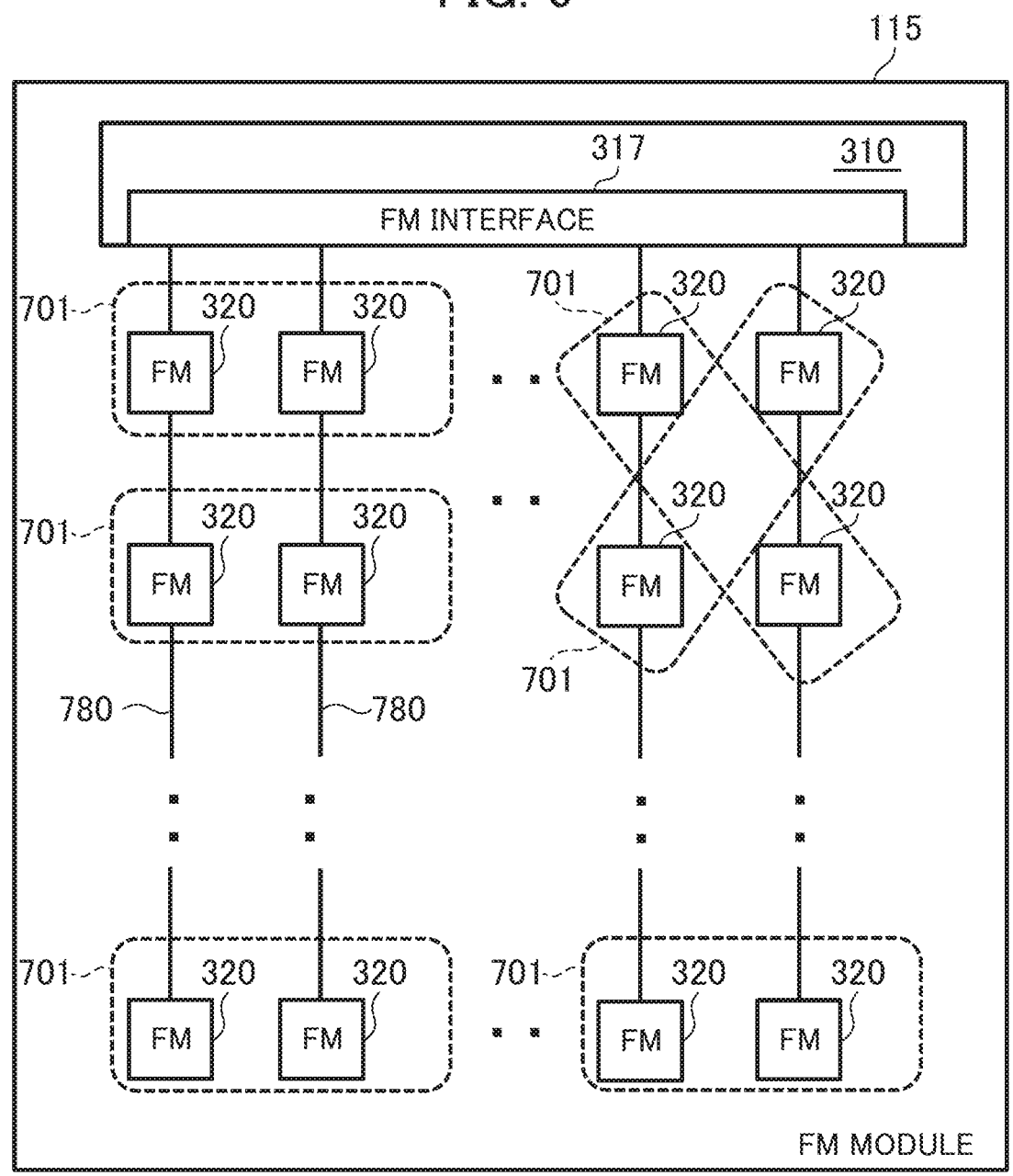
FIG. 6 shows an example of an FM group.

Next, the FM group 701 in this embodiment will be described. As described above, in this embodiment, the ECCCW being the error bit correction unit is divided into two ECCCW portions and the two ECCCW portions are recorded in two FMs 320. Therefore, to extract user data from the two ECCCW portions, the FM controller 310 reads the two ECCCW portions from the two FMs 320, configures ECCCW on the basis of the two ECCCW portions, and is required to acquire the user data from the ECCCW. If two ECCCW portions are dispersively recorded in FMs 320 sharing an FM bus, operation for reading the ECCCW portions from the two FMs 320 is apt to compete and deterioration of performance may be caused. Then, in this embodiment, as shown in FIG. 6, the FM group 701 is configured by two FMs 320 connected to two different FM buses 780. When a competitive rate in control is small even if two FMs are connected to the same FM bus 780 and the two FMs 320 can be controlled substantially in parallel, the two FMs 320 belonging to the same FM bus 780 may also configure the FM group 701.

FIG. 6 shows an example of the FM group 701.

In this embodiment, as ECCCW is recorded in two FMs 320 as each divided ECCCW portion, the FM group 701 is configured every two FMs 320.

As it is considered that a degree of mixture of low-quality FMs is small, an effect of the low-quality FM 320 can be reduced by grouping the two FMs 320, and it can be expected that the allowable erasing frequency of the FM module 115 is increased. However, it is rarely possible that two FMs 320 configuring the FM group 701 are both low-quality FMs. In this case, in this embodiment, FM in the FM group is replaced with another FM by an FM group change process described later. As a result, the erasing frequency of the FM module 115 is increased.

The FM group 701 in this embodiment has been described.

(1-5) Management Information of FM Module

Next, management information of the FM module 115 in this embodiment will be described referring to FIG. 7.

FIG. 7 shows a configuration of management information 800 held by the FM module 115.

The management information 800 includes an FM group table 810 and a logical-to-physical address conversion table 820.

The FM group table 810 manages a configuration of the FM group 701. Concretely, for example, the FM group table 810 is provided with records every FM group 701. In each record, information such as an FM group number 811, an FM-A number 812, an FM-B number 813, a count of a retry counter 814 and a count of an error bit counter 815 is stored.

The FM group number 811 denotes a number of an FM group (one example of ID). The FM-A number 812 denotes a number of first FM (one example of ID) configuring the same FM group. The FM-B number 813 denotes a number of second FM configuring the same FM group.

The retry counter 814 denotes a frequency of retries of reading. The FM controller 310 executes a read retry when correction by ECC of an error bit is impossible. That is, the FM controller changes a read parameter (for example, reading voltage, reading time, a reading method and others) used in reading from the FM (selects an unselected read parameter) and reads an ECCCW portion from the FM according to the selected read parameter. The retry counter 814 shows a retry frequency (for example, a total value, a mean value, a minimum value or a maximum value) in one or more reading processing.

The error bit counter 815 shows an error bit count (for example, a mean value) caused in the FM group. The FM controller 310 monitors reliability of the FM section 325 by regularly reading each of all ECCCWs in the FM section 325, correcting error bits and acquiring the number of error bits caused in ECCCW. The error bit counter 815 shows an error bit count (a mean value) acquired in this monitoring.

At least one of a count of the retry counter 814 and a count of the error bit counter 815 is one example of an error frequency in the FM group.

The FM controller 310 (the embedded processor 315) specifies an FM group number corresponding to an address (typically a logical block address (LBA)) specified in a read command received from the high order device from the logical-to-physical address conversion table 820. Afterward, the FM controller 310 (the embedded processor 315) specifies an FM-A number and an FM-B number respectively corresponding to the specified FM group number from the FM group table 810.

In this embodiment, as the two FMs configure the FM group 701, the FM group table 810 has two columns of the FM-A number and the FM-B number. However, as the FM group is configured by three or more FMs when ECCCW is divided into three or more ECCCW portions and the three or more ECCCW portions are dispersively recorded in three or more FMs, the FM group table 810 has three or more columns as to the FM number.

The FM controller 310 provides LBA space being logical space to the high order device and acquires physical addresses actually storing data from the LBA space being logical space every 4 kB in size of the LBA. To perform such address conversion, the logical-to-physical address conversion table 820 is provided.

The logical-to-physical address conversion table 820 is provided with records every LBA field in predetermined size (for example, an address field for 4 kB). Each record stores information such as LBA 821, an FM group number 822, a block number 823, a page number 824 and an offset 825.

The LBA 821 shows leading LBA in the LBA field. In this embodiment, as the LBA space is a sector unit of 512 byte (B) and 4 kB is 0x8, values incremented every 0x8 are stored in order.

The FM group number 822 shows a number of the FM group corresponding to the LBA field. The block number 823 shows a block number (a block number common to two FMs configuring the same FM group) corresponding to the LBA field. The page number 824 shows a page number (a page number common to the two FMs configuring the same FM group) corresponding to the LBA field. The offset 825 shows a stored position on a page (a position from the top of a page) corresponding to the LBA field.

In this embodiment, as two ECCCW portions divided from the same ECCCW are recorded in areas of the same block number and the same page number of different FMs in the same FM group, one block number and one page number are stored in each LBA field in the logical-to-physical address conversion table 820. The present invention is not limited to this example. For example, when block numbers are different in a case of the same ECCCW, each block number of each FM in the FM group may also be stored in the logical-to-physical address conversion table. Similarly, when each ECCCW portion corresponding to the same ECCCW is recorded in an arbitrary physical area, block numbers, page numbers and offsets respectively of the same numbers as divided numbers are required in the logical-to-physical address conversion table.

(1-6) Writing Process by FM Module 115

Next, a writing process by the FM module 115 will be described.

Figure 8:
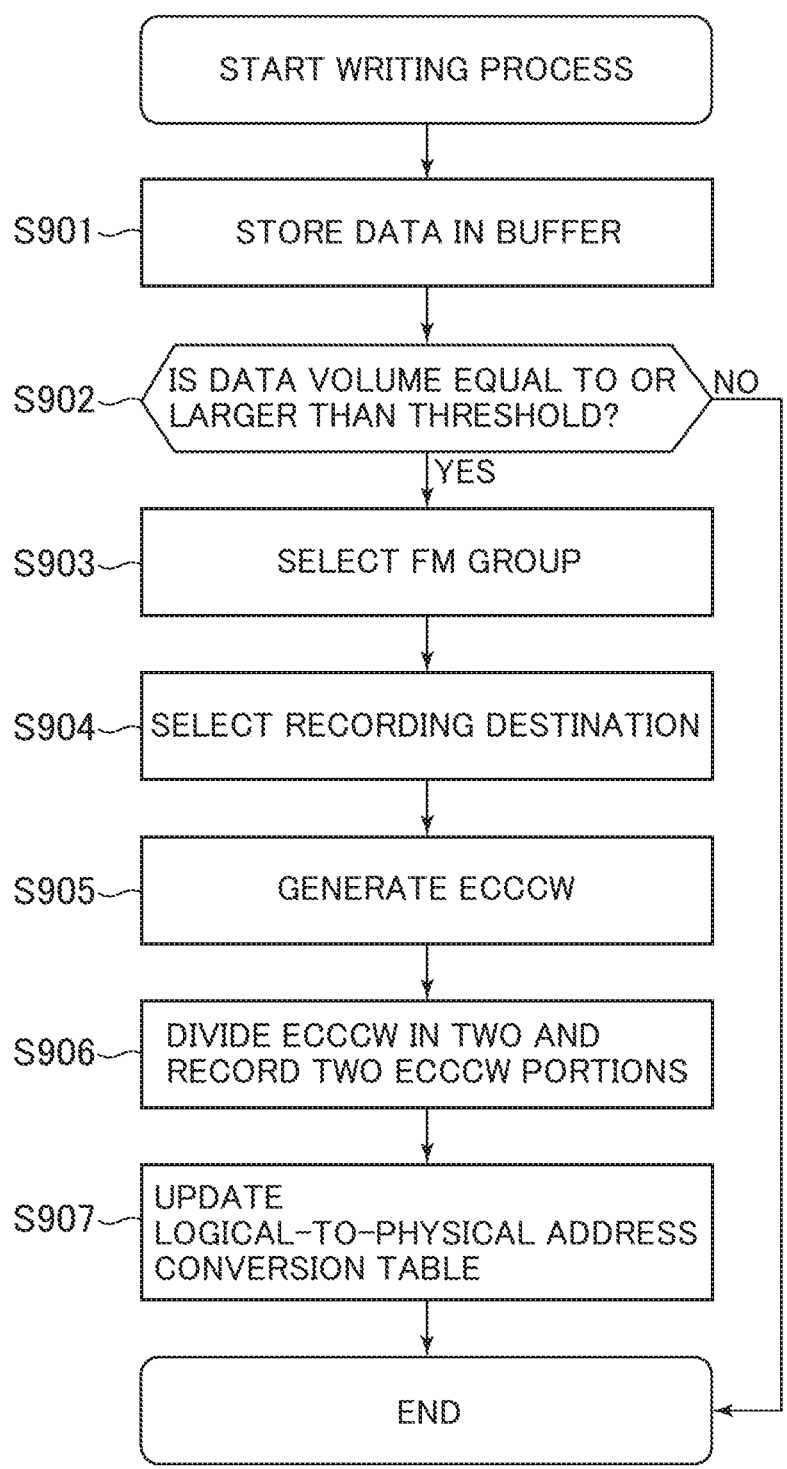
FIG. 8 shows a flow of a writing process by the FM module.

FIG. 8 shows a flow of the writing process by the FM module 115. The writing process is started in response to a write command from the high order device.

In S901, the embedded processor 315 specifies LBA specified in the write command, acquires write data from the high order device, and stores the write data in the data buffer 316 (or the RAM 313).

In S902, the embedded processor 315 judges whether or not data volume of the data (data to be recorded such as data according to the write command) stored in the data buffer 316 is equal to or exceeds a threshold (for example, volume for two pages). When a result of judgment in S902 is negative (S902: No), the embedded processor 315 records no data in the FM 320. That is, until volume of data stored in the data buffer 316 exceeds the threshold, recording of the data in the FMs is not performed. In the meantime, when the result of judgment in S902 is affirmative (S902; Yes), the process proceeds to S903.

In S903, the embedded processor 315 refers to the FM group table 810 and selects the FM group of a write destination. For example, the embedded processor 315 measures volume of data stored in the FM group 701 every FM group 701 and selects the FM group 701 so that the data volume is leveled.

In S904, the embedded processor 315 selects a recording destination (for example, a block to be recorded) in the FM group 701 selected in S903. The embedded processor 315 maintains a fixed number of unwritten blocks every FM group 701 for example. The embedded processor 315 selects a block having a relatively small erasing frequency out of the fixed number of unwritten blocks corresponding to the FM group 701 selected in S903. Hereby, the erasing frequencies of the FMs are leveled. The selected block is a block to be recorded. When the unwritten blocks decreases, the number of unwritten blocks is maintained to be fixed by control called reclamation or garbage collection.

In S904, further, the following processing is performed for example. First, the embedded processor 315 tries to select the selected block during recording in which a part of a page is already written. When no block during recording exists, the embedded processor 315 selects any unwritten block. In addition, the embedded processor 315 counts the number of recorded pages every block during recording, acquires a number of an already recorded final page in the block during recording in S904, and selects a page incremented by 1 to the already recorded final page number as a page of the recording destination.

In S905, the embedded processor 315 controls the ECC generation circuit 317 to generate ECC for data to be recorded and configures ECCCW.

In S906, the embedded processor 315 divides the ECCCW into two ECCCW portions and respectively records the two ECCCW portions in two pages (pages selected in S904) in two blocks (blocks selected in S904) in two FMs configuring the FM group selected in S903. When S906 is completed, a response to the write command may be returned by the embedded processor 315.

In S907, the embedded processor 315 updates the logical-to-physical address conversion table 820. That is, the embedded processor 315 registers a number of the FM group selected in S903, numbers of the block and the page respectively selected in S904 in records corresponding to the LBA field to which the LBA of the write destination belongs in the logical-to-physical address conversion table 820.

The writing process by the FM module 115 has been described.

(1-7) Reading Process by FM Module 115

Next, a reading process by the FM module 115 will be described referring to FIG. 9.

Figure 9:
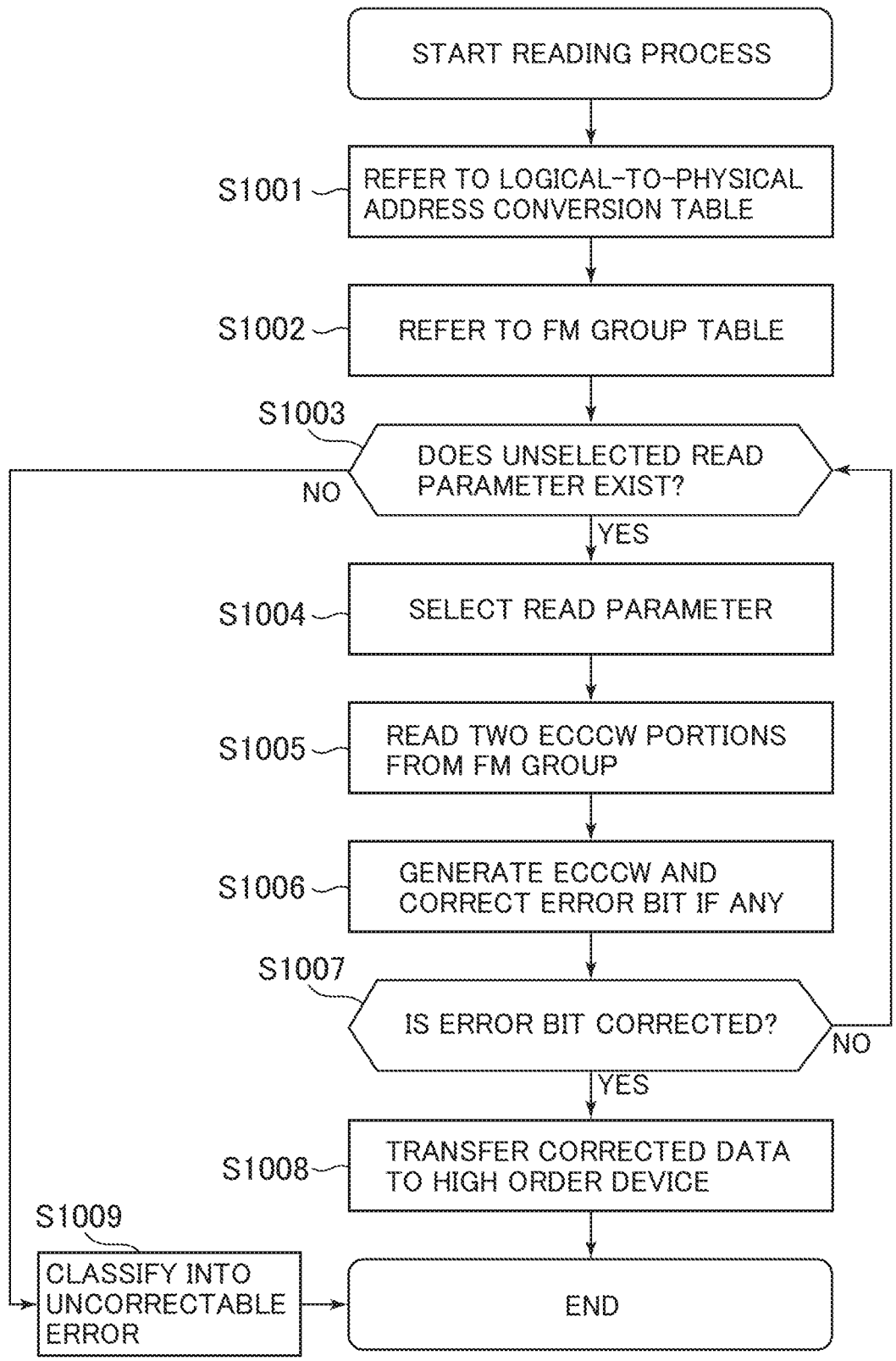
FIG. 9 shows a flow of a reading process by the FM module.

FIG. 9 shows a flow of the reading process by the FM module 115. The reading process is started in response to a read command from the high order device.

In S1001, the embedded processor 315 specifies a physical address (an FM group number 822, a block number 823, a page number 824 and an offset 825) corresponding to an LBA field to which LBA specified in the read command belongs using the logical-to-physical address conversion table 820. When a reading range (for example, a range specified on the basis of the LBA and data length respectively specified in the read command) extends over plural LBA fields, physical addresses of each of the plural LBA fields are specified using the logical-to-physical address conversion table 820. For example, when the reading range is 128 kB, physical addresses in units of 4 kB in each of 32 pieces of LBA fields are specified using the logical-to-physical address conversion table 820 in which physical addresses are managed in units of 4 kB. To simplify description, the FM group number specified in S1001 shall be one below.

In S1002, the embedded processor 315 specifies records corresponding to the FM group number (the FM-A number, the FM-B number and others) out of the physical addresses specified in S1001 using the FM group table 810.

In S1003, the embedded processor 315 judges whether an unselected read parameter exists as to the FM group specified in S1001 or not. When a result of judgment in S1003 is negative (S1003: No), the embedded processor 315 notifies the high order device of an uncorrectable error in S1009.

When the result of judgment in S1003 is affirmative (S1003: Yes), the embedded processor 315 selects any unselected read parameter in S1004.

In S1005, the embedded processor 315 reads two ECCCW portions from the corresponding areas (areas according to the physical addresses specified in S1001) of the two FMs specified in S1002 according to the read parameter selected in S1004.

In S1006, the embedded processor 315 generates ECCCW by integrating the two ECCCW portions read in S1005 and if an error bit exists in data in the ECCCW, the embedded processor corrects the error bit using the ECC correction circuit 318.

In S1007, the embedded processor 315 judges whether the error bit in the data in the ECCCW is corrected or not. When a result of judgment in S1007 is negative (S1007: No), the embedded processor 315 changes the read parameter to new one in S1003 and S1004, and retries reading in S1005. At this time, the embedded processor 315 updates a retry counter 814 corresponding to the FM group being a read source (that is, the embedded processor counts a retry frequency). In the meantime, when the result of judgment in S1007 is affirmative (S1007: Yes), the process proceeds to S1008.

In S1008, the embedded processor 315 returns the data corrected in S1006 to the high order device as a response to the read command.

The reading process by the FM module 115 has been described.

(1-8) FM Group Evaluation Process by FM Module

Next, an FM group evaluation process by the FM module 115 will be described referring to FIG. 10.

Figure 10:
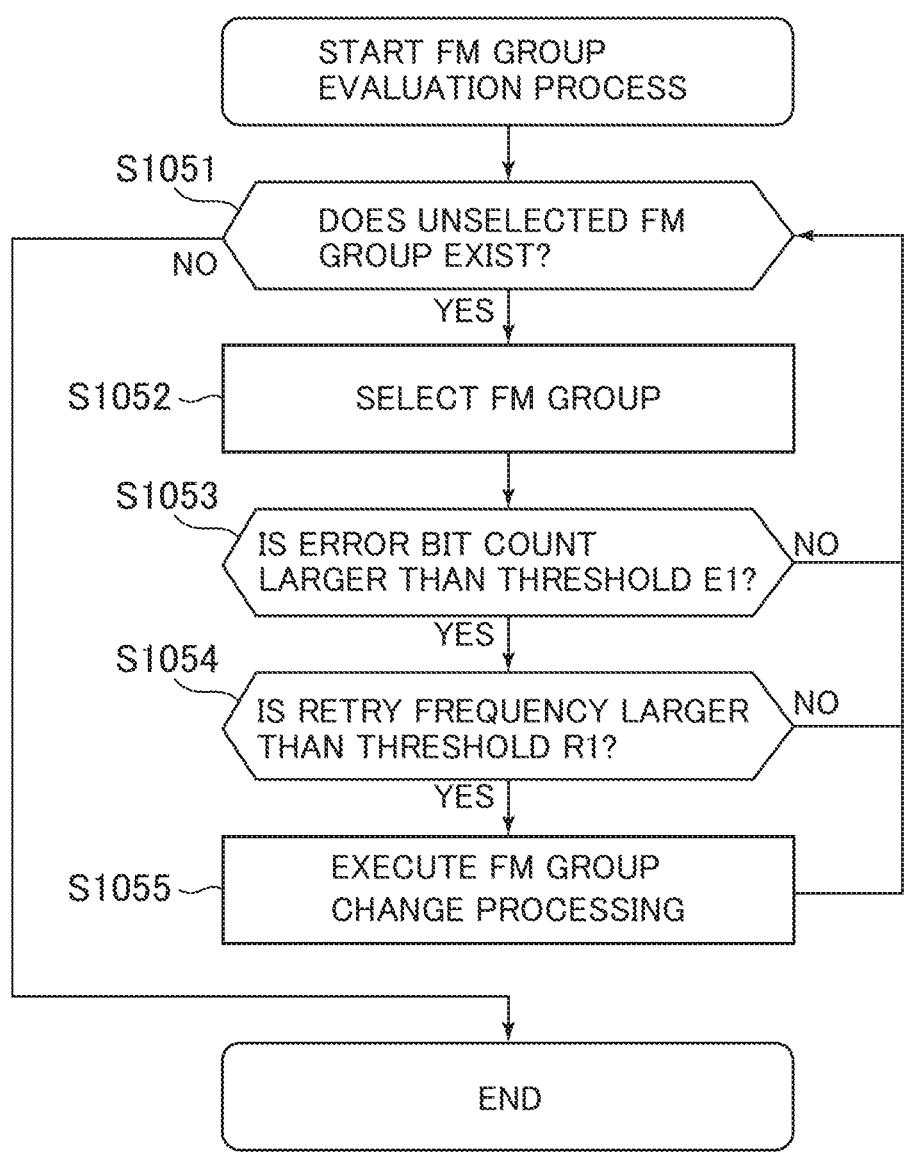
FIG. 10 shows a flow of an FM group evaluation process by the FM module.

FIG. 10 shows a flow of the FM group evaluation process by the FM module 115. The FM group evaluation process is performed asynchronously (for example, regularly) with the reading process. The FM group evaluation process may also be performed while reading processing is executed in the FM group of the read source.

In S1051, the embedded processor 315 judges whether an unselected FM group exists in the evaluation process or not. As evaluation of all the FM groups is finished when a result of judgment in S1051 is negative (S1051: No), the evaluation process is finished. When the result of judgment in S1051 is affirmative (S1051: Yes), the process proceeds to S1052.

In S1052, the embedded processor 315 selects any of unselected FM groups.

In S1053, the embedded processor 315 judges whether or not a count of an error bit counter 815 corresponding to the FM group selected in S1052 exceeds a threshold E1 (a first threshold of the error bit counter 815). When the FM group evaluation process is performed while reading processing is executed in the FM group of a read source, the threshold E1 may be a smaller value than the number of error bits correctable using the ECC. The embedded processor 315 may acquire the number of error bits caused in ECCCW configured in reading processing from the ECC correction circuit 318 that performs correction. When a result of judgment in S1053 is negative (S1053: No), the process is returned to S1051. When the result of judgment in S1053 is affirmative (S1053: Yes), the process proceeds to S1054.

In S1054, the embedded processor 315 judges whether a count of a retry counter 814 corresponding to the FM group selected in S1052 exceeds a threshold R1 (a first threshold of the retry counter 814) or not. When a result of judgment in S1054 is negative (S1054: No), the process is returned to S1051. When the result of judgment in S1054 is affirmative (S1054: Yes), the FM group selected in S1052 is turned an object of the FM group change process and the process proceeds to S1055.

The FM group evaluation process by the FM module 115 has been described.

According to the evaluation process, the FM group in which a count of the error bit counter 815 exceeds the threshold E1 and a count of the retry counter 814 exceeds the threshold R1 is turned an object of the FM group change process. In other words, even if a count of the error bit counter 815 exceeds the threshold E1, the FM group is not an object of the FM group change process when a count of the retry counter 814 is equal to or smaller than the threshold R1. The reason is that a retry frequency has room and therefore, if retry and error bit correction are performed, a decrease of an error bit count can be expected.

The FM group as an object of the FM group change process may also be the FM group that meets either of a condition that a count of the error bit counter 815 exceeds the threshold E1 or a condition that a count of the retry counter 814 exceeds the threshold R1. Hereby, leveling of quality according to improvement in quality of the FM group having a high error frequency in a count of the error bit counter 815 or the retry counter 814 can be expected.

(1-9) FM Group Change Process by FM Module 115

Next, the FM group change process by the FM module 115 will be described referring to FIG. 11.

Figure 11:
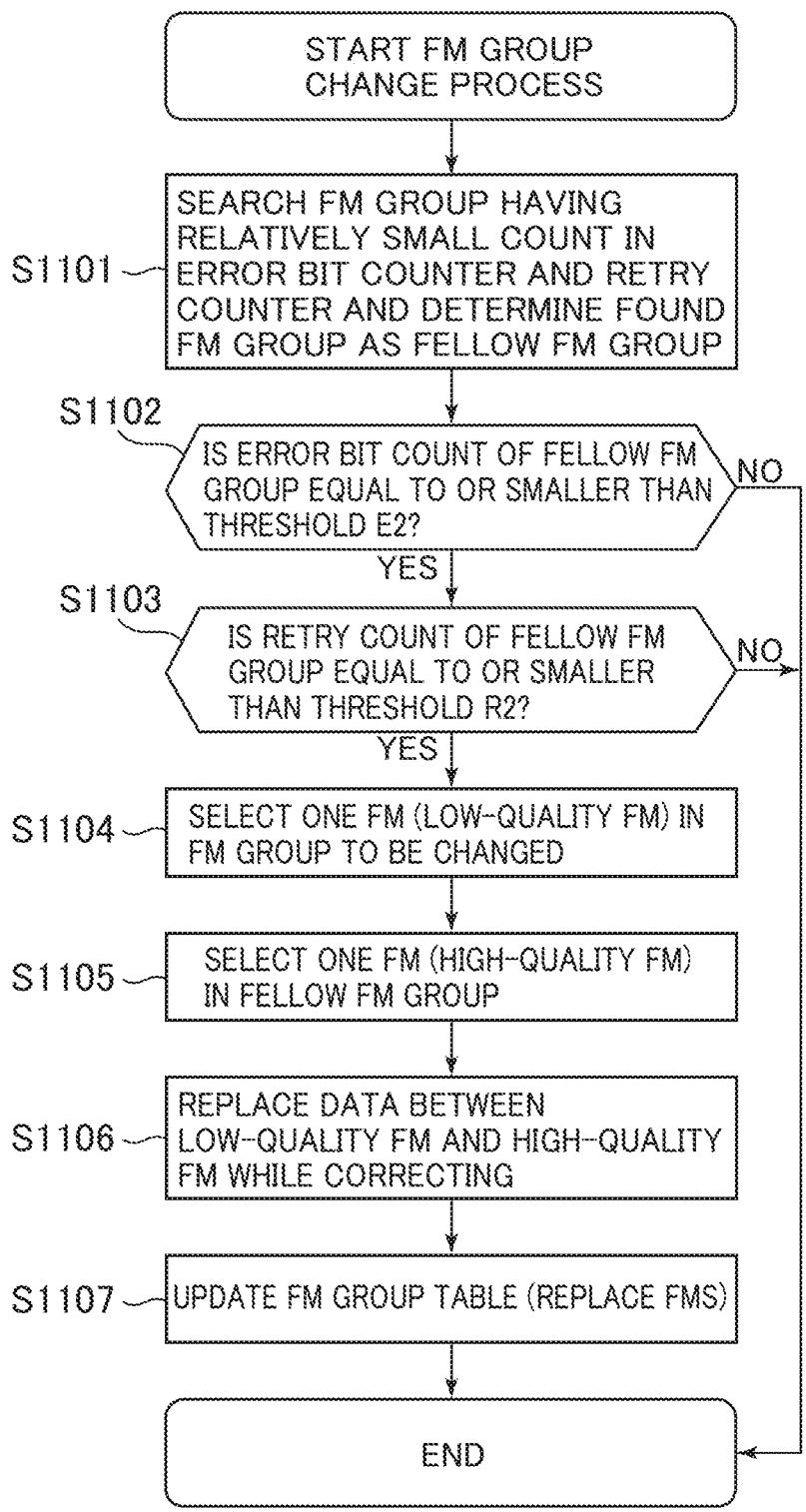
FIG. 11 shows a flow of an FM group change process by the FM module.

FIG. 11 shows a flow of the FM group change process by the FM module 115.

As described above, the embedded processor 315 determines an FM group having a large count in the error bit counter 815 or the retry counter 814 as an FM group to be changed (an FM group being an object of the FM group change process). As it is considered that the number of low-quality FMs is small, it is considered to be rare that all FMs configuring the FM group have low quality. The FM module 115 can maintain higher reliability by changing the FM group when this rare state is detected.

In S1101, the embedded processor 315 searches an FM group having a relatively small count in the error bit counter 815 and the retry counter 814 and determines the found FM group as a fellow FM group (an FM group being a replacement source with FM in the group to be changed).

In S1102, the embedded processor 315 judges whether or not a count of an error bit counter 815 corresponding to the fellow FM group is equal to or below a threshold E2 (a second threshold of the error bit counter 815). The threshold E2 may also be the same as the threshold E1 or may also be different from it. When a result of judgment in S1102 is negative (S1102: No), the change process is finished. The reason is that even if FM in the FM group to be changed is replaced with another FM, possibility that reliability of the FM group to be changed cannot be enhanced is high. In the meantime, when the result of judgment in S1102 is affirmative (S1102: Yes), the process proceeds to S1103.

In S1103, the embedded processor 315 judges whether or not the count of the retry counter 814 corresponding to the fellow FM group is equal to or below a threshold R2 (a second threshold of the retry counter 814). The threshold R2 may also be the same as the threshold R1 or may also be different from it. When a result of judgment in S1103 is negative (S1103: No), the change process is finished. The reason is that even if FM in the FM group to be changed is replaced with another FM, possibility that the reliability of the FM group to be changed cannot be enhanced is high. In the meantime, when the result of judgment in S1103 is affirmative (S1103: Yes), the process proceeds to S1104.

In S1104, the embedded processor 315 selects one FM in the FM group to be changed. In S1104, the one FM is selected at random, however, the present invention is not limited to this example. If a position in which an error bit occurs can be verified in correcting using ECC, FM in which the most (or the fewest) error bits occur may also be selected. The FM selected in S1104 is ranked as low-quality FM.

In S1105, the embedded processor 315 selects one FM in the fellow FM group. In S1105, the one FM is selected at random, however, the present invention is not limited to this example. If a position in which an error bit occurs can be verified in correcting using ECC, FM having the fewest (or the most) error bits may also be selected. The FM selected in S1104 is ranked as high-quality FM.

In S1106, the embedded processor 315 replaces data between the low-quality FM selected in S1104 and the high-quality FM selected in S1105. Concretely, for example, the embedded processor 315 manages a space area for replacing data every FM. The embedded processor 315 reads ECCCW portions from the FM group to be changed, generates ECCCW by integrating the read ECCCW portions, and corrects an error bit. The embedded processor divides the corrected ECCCW into ECCCW portions again and records the ECCCW portion having the low-quality FM as a recording destination in a space area of the high-quality FM (the selected FM in the fellow FM group). By this processing, the already occurring error bit is corrected and data can be transferred to another FM. The embedded processor 315 erases data from an area as a transfer destination in the high-quality FM and records the data in the low-quality FM (the data in the space area in the high-quality FM) in the erased area. At this time, similarly as to the fellow FM group, the embedded processor 315 reads ECCCW portions from the fellow FM group, integrates the read ECCCW portions, and generates ECCCW. The embedded processor 315 corrects data in the ECCCW using ECC, divides ECCCW including the corrected data into ECCCW portions, and records the ECCCW portion having the high-quality FM as a recording destination out of the divided ECCCW portions in a space area in the low-quality FM. As described above, ECCCW portions can be replaced between two FMs by alternately repeating data transfer from the low-quality FM to the high-quality FM and data transfer from the high-quality FM to the low-quality FM in small size even if space areas for replacing data are small.

In S1107, the embedded processor 315 updates the FM group table 810. That is, the embedded processor 315 replaces data between the low-quality FM in the FM group to be changed and the high-quality FM in the fellow FM group. More concretely, the embedded processor 315 updates an FM number of the low-quality FM in a record corresponding to the FM group to be changed to an FM number of the high-quality FM and also updates the FM number of the high-quality FM in a record corresponding to the fellow FM group to the FM number of the low-quality FM.

The FM group change process by the FM module 115 has been described. Data in the FM which has high possibility of having low quality is replaced with data in the FM which has high possibility of having high quality by executing the FM group change process and as a result, it can be expected that quality of the FMs can be more leveled, in other words, the allowable erasing frequency of the FM module 115 (substantially, equivalent to rewritable data volume) can be further increased.

One embodiment and one transformed example of the present invention have been described. However, these are examples for explaining the present invention and a scope of the present invention is not limited to only the embodiment and the transformed example. The present invention can also be embodied in other various embodiments. For example, the present invention can also be applied to NVM except the FM 320.

What is claimed is:

1. A nonvolatile memory (NVM) module, comprising:
   an NVM section including one or more nonvolatile memories (NVMs) each of which is provided with a plurality of storage areas that each include at least one minimum erasing unit; and
   an NVM controller connected to the NVM section, wherein the NVM controller generates an ECC codeword (ECCCW) acquired by applying an error correction code (ECC) to each data piece to be recorded; and the NVM controller divides each ECCCW into N pieces (N: two or a larger integer) of ECCCW portions and records the N pieces of ECCCW portions in N respective pieces of storage areas, where each piece of storage area is within a different minimum erasing unit.

2. The nonvolatile memory module according to claim 1, wherein each of the N pieces of storage areas in which each ECCCW portion is recorded is a storage area in the same unit or a larger unit as/than a minimum record unit.

3. The nonvolatile memory module according to claim 2, wherein each of the one or more NVMs is a flash memory (FM);

each FM includes one or more dies each of which is an independent and controllable unit;

each die includes blocks each of which is the minimum erasing unit;

each block includes pages each of which is a minimum record unit; and each of the N pieces of storage areas in which each ECCCW portion is recorded is any of the page, the block, the die and the FM.

4. The nonvolatile memory module according to claim 1, comprising:

a plurality of buses connecting the NVM controller with the NVM section, wherein the N pieces of storage areas in which each ECCCW portion is recorded are connected to different N pieces of buses out of the plurality of buses.

5. The nonvolatile memory module according to claim 1, wherein the NVM controller manages one or more storage area groups;

each of the one or more storage area groups is configured by N pieces of storage areas;

the NVM controller selects a storage area group an error frequency of which exceeds a threshold out of the one or more storage area groups; and the NVM controller replaces data between a first storage area out of N pieces of storage areas configuring the selected storage area group and a second storage area except the N pieces of storage areas.

6. The nonvolatile memory module according to claim 5, wherein the NVM controller selects any read parameter unselected in a reading process out of two or more read parameters in the reading process;

the NVM controller reads N pieces of ECCCW portions from N pieces of storage areas configuring a storage area group to which an address of a reading source belongs according to the selected read parameter in the reading process;

the NVM controller generates ECCCW on the basis of the read N pieces of ECCCW portions in the reading process;

the NVM controller judges whether data in the generated ECCCW can be corrected using ECC in the ECCCW or not when an error bit exists in the data in the generated ECCCW in the reading process;

the NVM controller executes selecting any read parameter unselected in the reading process as retry when a result of the judgment is negative; and the storage area group the error frequency of which exceeds the threshold is at least one of a storage area group an error bit count of which exceeds its threshold and a storage area group a retry frequency of which exceeds its threshold.

7. The nonvolatile memory module according to claim 6, wherein the storage area group the error frequency of which exceeds the threshold means a storage area group the error bit count of which exceeds its threshold and the retry frequency of which exceeds its threshold.

8. The nonvolatile memory module according to claim 5, wherein the first storage area is any storage area in the selected storage area group; and the second storage area is any storage area in the storage group the error frequency of which is equal to or below the threshold.

9. The nonvolatile memory module according to claim 5, wherein the NVM controller reads N pieces of ECCCW portions from the storage area group including the first storage area so as to replace data between the first storage area and the second storage area, generates ECCCW on the basis of the N pieces of ECCCW portions, corrects data in the ECCCW using ECC in the ECCCW, divides the ECCCW into N pieces of ECCCW portions, and records the ECCCW portion having the first storage area as a recording destination out of the N pieces of ECCCW portions in the second storage area; and the NVM controller reads N pieces of ECCCW portions from a storage area group including the second storage area, generates ECCCW on the basis of the N pieces of ECCCW portions, corrects data in the ECCCW using ECC in the ECCCW, divides the ECCCW into N pieces of ECCCW portions, and records the ECCCW portion having the second storage area as a recording destination out of the N pieces of ECCCW portions in the first storage area.

10. A storage system, comprising:

a nonvolatile memory (NVM) module; and processors that transmit data to the nonvolatile memory module, wherein the nonvolatile memory module includes:

an NVM section including one or more nonvolatile memories (NVMs) each of which is provided with a plurality of storage areas that each include at least one minimum erasing unit; and an NVM controller connected to the NVM section;

the NVM controller generates an ECC codeword (ECCCW) acquired by applying an error correction code (ECC) to each data piece to be recorded which is transmitted from the processor; and the NVM controller divides the ECCCW into N pieces (N: two or a larger integer) of ECCCW portions and records the N pieces of ECCCW portions in N respective pieces of storage areas, where each piece of storage area is within a different minimum erasing unit.

11. A storage control method, comprising the steps of:

generating an ECC codeword (ECCCW) by applying an error correction code (ECC) to each data piece to be recorded;

dividing each ECCCW into N pieces (N: two or a larger integer) of ECCCW portions; and recording the N pieces of ECCCW portions in N respective pieces of storage areas, where each piece of storage area is within a different minimum erasing unit in one or more nonvolatile memories (NVMs) configuring a nonvolatile memory (NVM) section.

* * * * *